United States Patent [19]

Nakatani et al.

[11] Patent Number: 4,628,285
[45] Date of Patent: Dec. 9, 1986

[54] 3-TERMINAL OSCILLATING ELEMENT AND OSCILLATOR EMPLOYING THE SAME

[75] Inventors: Hiroshi Nakatani, Kanazawa; Jiro Inoue, Ishikawa; Masashige Miyamori, Hakui, all of Japan

[73] Assignee: Murata Manufacturing Co., Ltd., Japan

[21] Appl. No.: 686,010

[22] Filed: Dec. 27, 1984

Related U.S. Application Data

[63] Continuation-in-part of Ser. No. 441,644, Nov. 15, 1982.

[30] Foreign Application Priority Data

Nov. 16, 1981 [JP] Japan ................ 56-184194

[51] Int. Cl.$^4$ ............................................ H03B 5/32
[52] U.S. Cl. .................................... 331/163; 331/158; 310/357; 310/366
[58] Field of Search ............. 331/116 R, 117 R, 158, 331/163; 310/311, 357, 366; 368/159

[56] References Cited

U.S. PATENT DOCUMENTS 4,336,510 6/1982 Miyamori ................ 310/357 X

Primary Examiner—Eugene R. LaRoche
Assistant Examiner—Robert J. Pascal

Attorney, Agent, or Firm—Ostrolenk, Faber, Gerb & Soffen

[57] ABSTRACT

A 3-terminal oscillating element has a square plate-like piezoelectric body, first and second electrodes provided on one surface of the piezoelectric body and a common electrode provided on the other surface of the piezoelectric body. The piezoelectric body is polarized in one direction between the first and common electrodes and in the opposite direction between the second and common electrode. The 3-terminal oscillating element, when provided in place of a combination of 2-terminal oscillating element and two externally provided capacitors $C_1$ and $C_2$ in a Colpitts circuit, substantially satisfies the following equations:

$$\frac{C_2}{C_1} = \frac{1}{n} \cdot \frac{C_{02}}{C_{01}}$$

wherein $C_{01}$ is an electrostatic capacitance between the first electrode and the counter electrode, $C_{02}$ is an electrostatic capacitance between the second electrode and the counter electrode, and n is an transformation ratio of an ideal transformer; and $$1 \leq \frac{S_2}{S_1} \leq 10$$

wherein $S_1$ and $S_2$ are areas of first and second electrodes, respectively.

5 Claims, 15 Drawing Figures

$C_{01}$: CAPACITANCE BETWEEN ELECTRODES 2 and 4
$C_{02}$: CAPACITANCE BETWEEN ELECTRODES 3 and 4

$C_{01}$: CAPACITANCE BETWEEN ELECTRODES 2 and 4
$C_{02}$: CAPACITANCE BETWEEN ELECTRODES 3 and 4

3-TERMINAL OSCILLATING ELEMENT AND OSCILLATOR EMPLOYING THE SAME

This application is a continuation-in-part application of U.S. patent application Ser. No. 441,644 filed Nov. 15, 1982.

BACKGROUND OF THE INVENTION

1. Field of the Invention

The present invention relates to a piezoelectric oscillating element having three terminals, and also to a method for making such a 3-terminal oscillating element. It further relates to an oscillator employing such an oscillating element.

2. Description of the Prior Art

Figure 1:
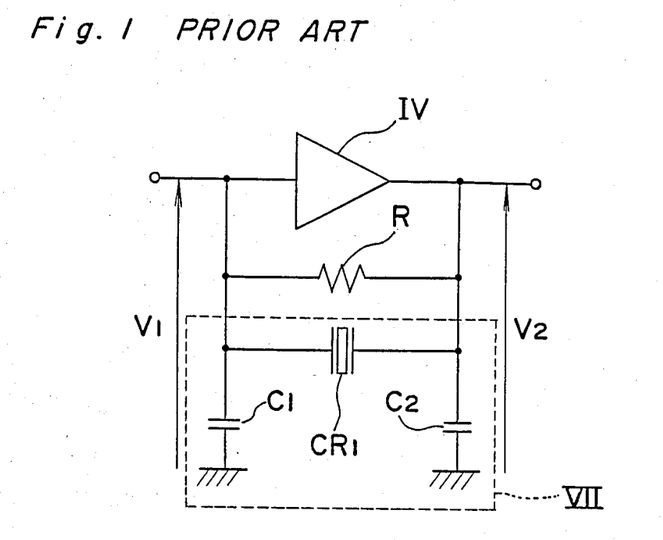
FIG. 1 is an oscillation circuit of prior art employing a 2-terminal piezoelectric oscillating element in combination with two externally provided capacitors.

In compliance with the recent development of microcomputer, a piezoelectric oscillating element made of ceramic has become widely used in a Colpitts circuit. Particularly, in a C-MOS type LSI, a circuit shown in FIG. 1 is often employed. In FIG. 1, IV designates an inverter, R designates a feedback resistor, $CR_1$ designates a 2-terminal piezoelectric oscillating element made of ceramic, and $C_1$ and $C_2$ designate, respectively, externally provided capacitors. In order to obtain a stable oscillation, an input voltage $V_1$ and an output voltage $V_2$ are set to appropriate voltages by the adjustment of capacitance of each of the capacitors $C_1$ and $C_2$.

The circuit shown in FIG. 1, however, takes disadvantages in that (i) since the temperature characteristic of piezoelectric ceramic element $CR_1$ differs from that of the externally provided capacitors $C_1$ and $C_2$, the temperature characteristic of oscillating frequency becomes deteriorated, and that (ii) the circuit requires two externally provided capacitors resulting in bulky in size.

In the recent developments, these two disadvantages have been solved. A development for eliminating the disadvantage (i) is described below.

Figure 2:
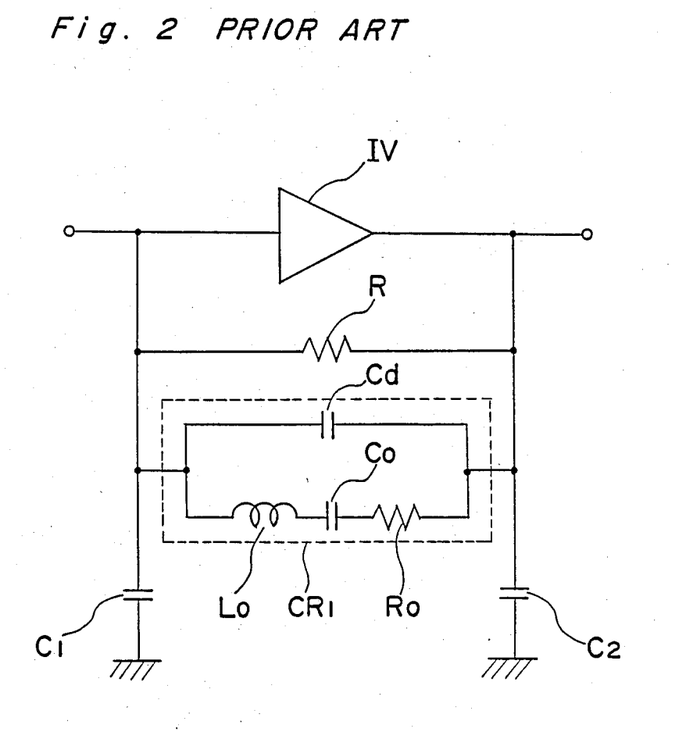
FIG. 2 is an equivalent circuit of the circuit shown in FIG. 1.

In FIG. 2, there is shown a circuit which is equivalent to the circuit shown in FIG. 1. In the circuit of FIG. 2, the oscillating frequency $f_{osc}$ can be given as:

$$f_{osc} \approx \frac{1}{2\pi \sqrt{L_0 \cdot \frac{C_0\left(C_d + \frac{C_1 \cdot C_2}{C_1 + C_2}\right)}{C_0 + C_d + \frac{C_1 \cdot C_2}{C_1 + C_2}}}}$$

An anti-resonant frequency $f_a$ of the piezoelectric oscillating element $CR_1$ solely can be given as:

$$f_a = \frac{1}{2\pi \sqrt{L_0 \cdot \frac{C_0 \cdot C_d}{C_0 + C_d}}}$$

Generally, a temperature characteristic of a resonant circuit with a resonant frequency $f_0 = 1/2\pi\sqrt{LC}$ can be given as:

$$\frac{1}{f_0} \cdot \frac{df_0}{dt} = -\frac{1}{2}\left(\frac{1}{L} \cdot \frac{dL}{dt} + \frac{1}{C} \cdot \frac{dc}{dt}\right)$$

wherein t is temperature. From the above equation, an excellent temperature characteristic of resonant frequency $f_0$ can be obtained when $$-\frac{1}{L} \cdot \frac{dL}{dt} = \frac{1}{C} \cdot \frac{dc}{dt}$$

In usual cases, a material having an excellent temperature characteristic of anti-resonant frequency $f_a$ is employed as the piezoelectric oscillating element $CR_1$. In such a material, $$\frac{1}{f_a} \cdot \frac{df_a}{dt} \approx 0.$$

Therefore, when the temperature coefficient of each of the capacitors $C_1$ and $C_2$ is fixed to an amount equal to that of an equivalent capacitor $C0$ in the equivalent circuit, the resultant is that:

$$\frac{1}{f_{osc}} \cdot \frac{df_{osc}}{dt} \approx 0$$

This can be done by employing the same material for the capacitors $C_1$ and $C_2$ and for the piezoelectric oscillating element $CR_1$. When the above equation is accomplished, an excellent temperature characteristic of oscillating frequency can be obtained, and thus eliminating the above described disadvantage (i). A further detail of the above arrangement is disclosed in British Pat. No. 1,576,704.

Figure 3:
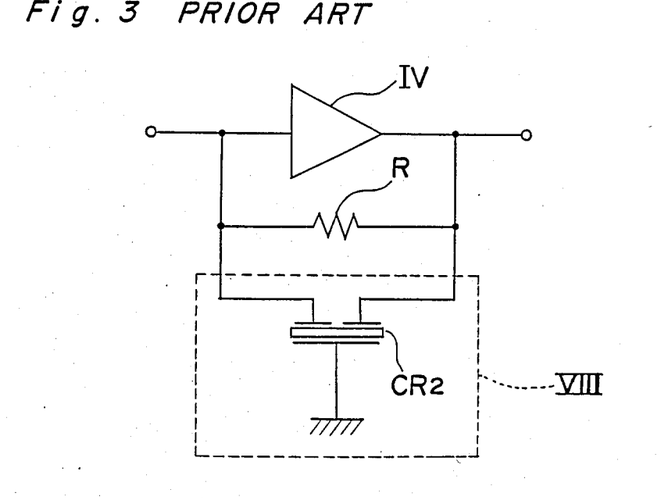
FIG. 3 is an oscillation circuit of prior art employing a 3-terminal piezoelectric oscillating element.
Figure 4:
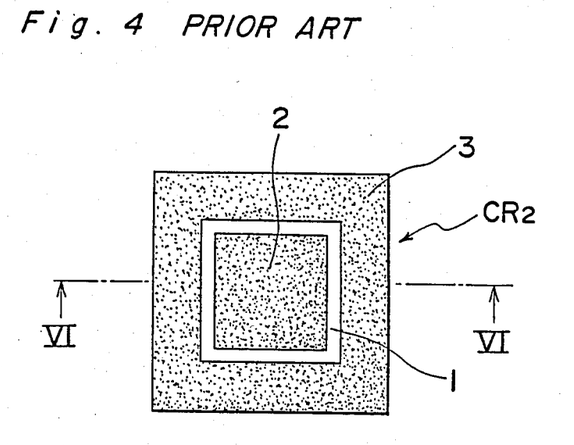
FIGS. 4 and 5 are top and bottom plan views, respectively, of the 3-terminal piezoelectric oscillating element shown in FIG. 3.
Figure 5:
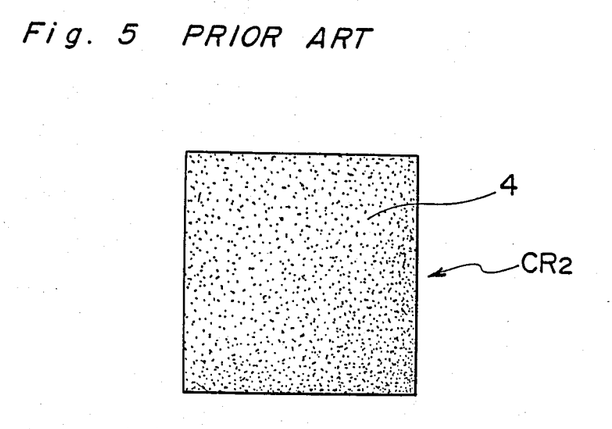
Figure 6:
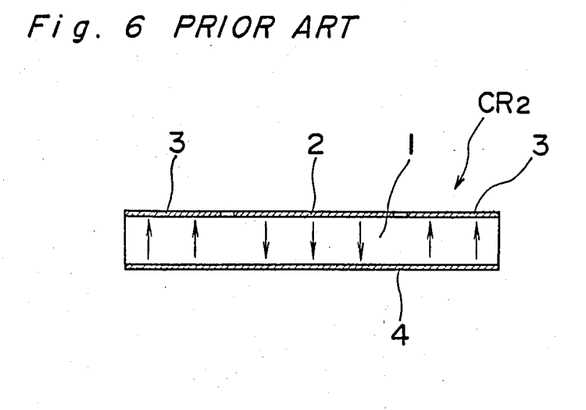
FIG. 6 is a cross-sectional view taken along a line VI—VI shown in FIG. 4.

A development for eliminating the disadvantage (ii) is disclosed in U.S. Pat. No. 4,336,510 in which a possibility of eliminating the externally provided capacitors $C_1$ and $C_2$ is disclosed. According to U.S. Pat. No. 4,336,510, a 3-terminal oscillating element $CR_2$ as shown in FIG. 3 is employed. An example of one embodied form of the 3-terminal oscillating element $CR_2$ is shown in FIGS. 4 to 6, which comprises a rectangular, such as a square piezoelectric ceramic plate 1 having opposite flat major surfaces. The upper flat major surface, as shown in FIG. 4, is provided with two electrodes, which are center electrode 2 in a shape of square and rim electrode 3 surrounding the center electrode 2. The lower flat major surface, as shown in FIG. 5, is provided with a common electrode 4 entirely on the lower major surface. FIG. 6 shows the direction of polarization in the piezoelectric plate 1 in which a region between center electrode 2 and common electrode 4 and a region between rim electrode 3 and common electrode 4 are poled in opposite directions. When the piezoelectric plate 1 is poled in opposite directions as shown in FIG. 6, the transformation ratio n of an ideal transformer, which will be described in detail later in connection with FIGS. 8 and 9, will become greater than zero and, therefore, the phase difference between the input voltage and output voltage of the oscillating element $CR_2$ will be 180°, resulting in oscillation of the element $CR_2$ in an expansion mode. In this case, the element $CR_2$ vibrates in a single mode.

Although U.S. Pat. No. 4,336,510 teaches the possibility of use of 3-terminal oscillating element $CR_2$ in place of the combination of 2-terminal oscillating element $CR_1$ and externally provided capacitors $C_1$ and $C_2$, it does not teach the necessary condition the 3-terminal oscillating element $CR_2$ must meet to accomplish the equivalency with the combination of 2-terminal oscillating element $CR_1$ and externally provided capacitors $C_1$ and $C_2$.

SUMMARY OF THE INVENTION

The present invention has been developed with a view to substantially solving the above described problem and has for its essential object to provide an improved 3-terminal oscillating element which meets the equivalency with the combination of 2-terminal oscillating element and externally provided capacitors when it is provided in place of such a combination.

It is also an essential object of the present invention to provide a method for determining the above described improved 3-terminal oscillating element.

It is a further object of the present invention to provide an oscillator which employs the above-mentioned oscillating element.

BRIEF DESCRIPTION OF THE DRAWINGS

These and other objects and features of the present invention will become apparent from the following description taken in conjunction with a preferred embodiment thereof with reference to the accompanying drawings, throughout which like parts are designated by like reference numerals, and in which.

DESCRIPTION OF THE PREFERRED EMBODIMENTS

Figure 7:
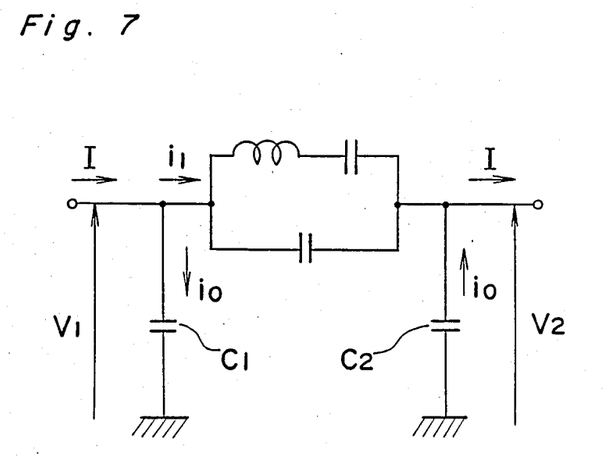
FIG. 7 is an equivalent circuit of a section enclosed by a line VII shown in FIG. 1.

Referring to FIG. 7, there is shown an equivalent circuit of a section enclosed by a broken line VII in FIG. 1. In the stable oscillating condition, a current I becomes 0. Therefore, following equations are obtained.

$$V_1 = i_0 \cdot \frac{1}{j\omega C_1}$$

$$V_2 = -i_0 \cdot \frac{1}{j\omega C_2}$$

$$\therefore \frac{V_2}{V_1} = -\frac{C_1}{C_2}$$

Figure 8:
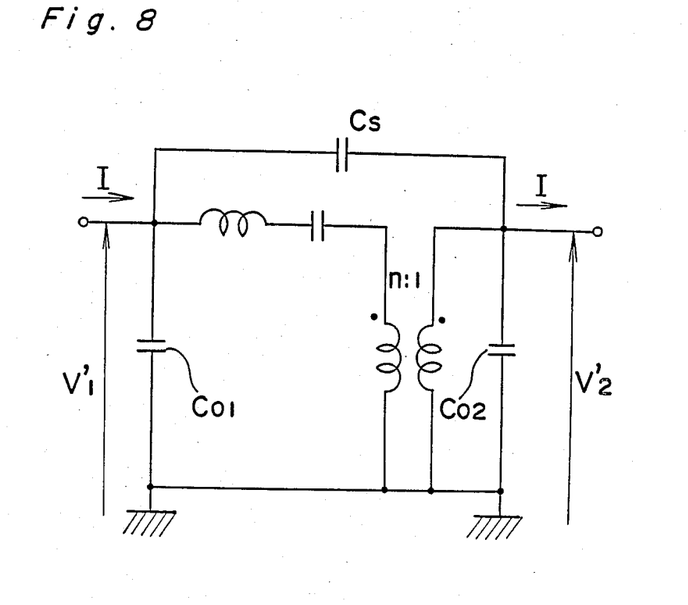
FIG. 8 is an equivalent circuit of a section enclosed by a line VIII shown in FIG. 3.
Figure 9:
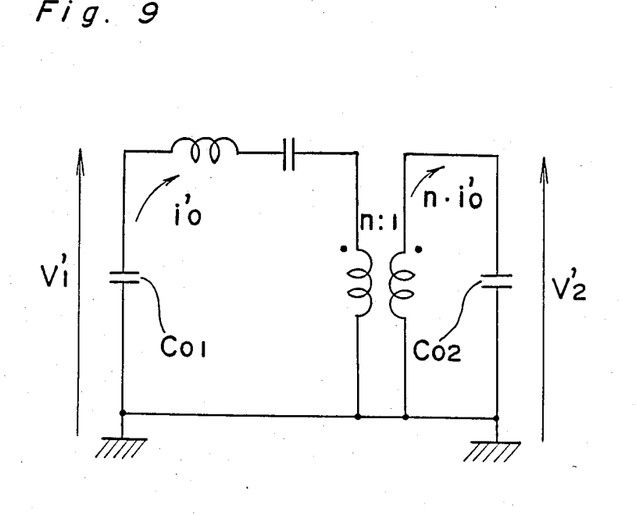
FIG. 9 is a simplified equivalent circuit of the circuit shown in FIG. 8.

On the other hand, FIG. 8 shows an equivalent circuit of a section enclosed by a broken line VIII in FIG. 3. In FIG. 8, $C_s$ designates an electrostatic capacitance between input and output electrodes, $C_{01}$ designates an electrostatic capacitance between the electrodes 2 and 4, and $C_{02}$ designates an electrostatic capacitance between the electrodes 3 and 4. Since $C_s << C_{01}$, $C_{02}$ (for example, $C_s$ is several picofarads, whereas $C_{01}$ and $C_{02}$ are several 100s' picofarads), $C_s$ can be disregarded. Thus, the circuit of FIG. 8 can be simplified as a circuit shown in FIG. 9. In FIG. 9, the stable oscillating condition is obtained when:

$$V_1' = -i_0' \cdot \frac{1}{j\omega C_{01}}$$

$$V_2' = n \cdot i_0' \cdot \frac{1}{j\omega C_{02}}$$

$$\therefore \frac{V_2'}{V_1'} = -\frac{n \cdot C_{01}}{C_{02}}$$

From the above equations, a following relation of a capacitance ratio is obtained.

$$\frac{C_2}{C_1} = \frac{1}{n} \cdot \frac{C_{02}}{C_{01}}$$

When the 3-terminal oscillating element $CR_2$ is provided in place of the combination of 2-terminal oscillating element $CR_1$ and externally provided capacitors $C_1$ and $C_2$ with the above described capacitance ratio being satisfied, an oscillating circuit employing the 3-terminal oscillating element $CR_2$ operates exactly in the same manner as an oscillating circuit employing the 2-terminal oscillating element $CR_1$ with externally provided capacitors $C_1$ and $C_2$. In other words, when the 3-terminal oscillating element $CR_2$ meets the above capacitance ratio, there will be an equivalency between the 3-terminal oscillating element $CR_2$ and the combination of 2-terminal oscillating element $CR_1$ and externally provided capacitors $C_1$ and $C_2$.

From a practical point of view, the 3-terminal oscillating element $CR_2$ that satisfies the above mentioned capacitance ratio is prepared in the steps of measuring the capacitance ratio $C_2/C_1$ and, thereafter, determining the amount of each of the parameters n, $C_{01}$ and $C_{02}$. The transformation ratio n is determined, e.g., by the location of the electrodes, the area ratio among such electrodes, the material of the piezoelectric ceramic plate 1, and the degree of polarization effected in the ceramic plate 1. The capacitances $C_{01}$ and $C_{02}$ are determined, e.g., by the area ratio among the electrodes and the degree of polarization effected in the ceramic plate 1. In this manner, the 3-terminal oscillating element of the present invention is completed. Since the 3-terminal oscillating element of the present invention has the same constructing parts as that shown in FIG. 3, a detailed description therefor is omitted for the sake of brevity.

According to one example, when the externally provided capacitors $C_1$ and $C_2$ respectively have capacitances 100 picofarads and 100 picofarads, the parameters n, $C_{01}$ and $C_{02}$ are set to 3, 100 picofarads and 300 picofarads, respectively to obtain a 3-terminal oscillating element $CR_2$ which is identical with the 2-terminal oscillating element $CR_1$ accompanying the two capacitors $C_1$ and $C_2$. In this case, the degree of polarization should be so controlled as to render the frequency difference between the resonance frequency and the anti-resonance frequency in a section between the center electrode 2 and the common electrode 4 being equal to the frequency difference between the resonance frequency and the anti-resonance frequency in a section between the rim electrode 3 and the common electrode 4. For example, for obtaining the central frequency of 450 KHz, a ceramic plate 1 having the dimension 4.9×4.9×0.9 (mm), a central electrode 2 having the dimension 2.1×2.1 (mm), and a rim electrode 3 having the length of inner side 2.8 (mm) are employed. The above given example has the capacitance ratio $C_{02}/n \cdot C_{01} = 1$.

Figure 10:
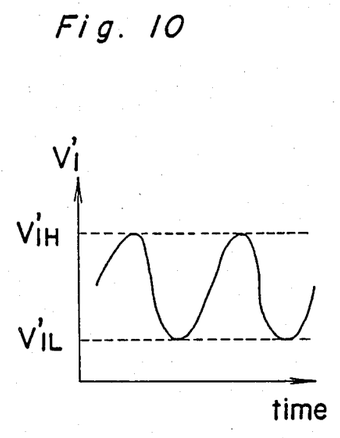
FIG. 10 is a waveform of input voltage signal of the circuit of FIG. 9.
Figure 11:
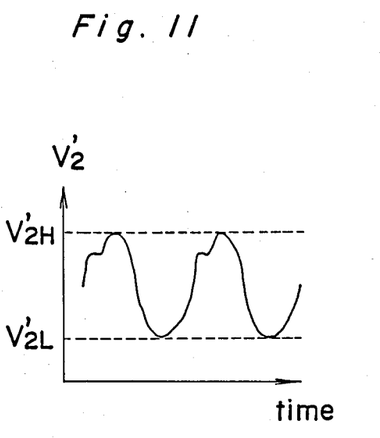
FIG. 11 is a waveform of output voltage signal of the circuit of FIG. 9.

Referring to FIGS. 10 and 11, there are shown waveforms, as obtained by an oscilloscope, of input and output voltages $V_1'$ and $V_2'$ applied to and produced from the inverter IV, respectively. When the power source voltage supplied to the inverter IV is $V_{DD}$, it is known in the art that in order to maintain the stable oscillation, following relations must be satisfied:

$$V'_{1H} \approx V_{DD} \approx V'_{2H},$$

$$V'_{1L} \approx 0 \approx V'_{2L}.$$

In the market, many types of inverter IV provided in an IC chip are available and such types can be classified from the view point of what capacitance ratio would match maintain the stable oscillation. One and most common type of inverter IV provided in an IC chip is the one that oscillates stable when the capacitance ratio is 1. For this type of inverter IV, the above given example of 3-terminal oscillating element can be employed. There are, however, other types of inverter IV that oscillates stable when the capacitance ratio is other than 1.

Figure 12:
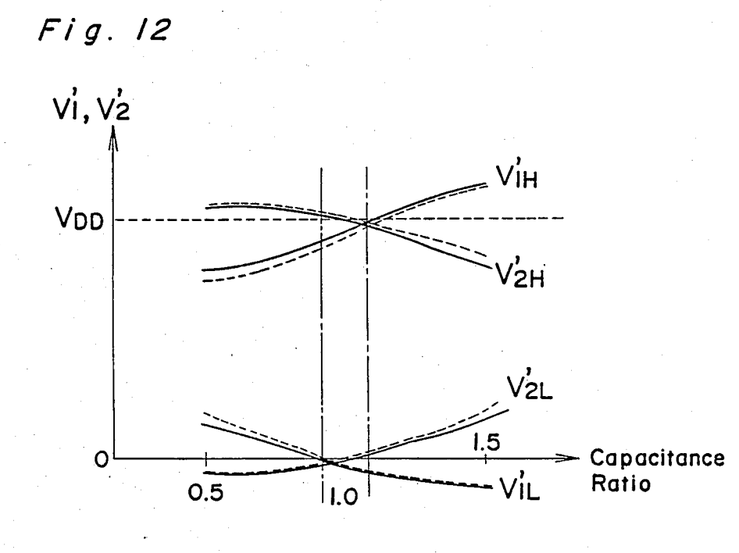
FIGS. 12 to 14 are graphs showing relationship between input or output voltage and capacitance ratio $C_2/C_1$ or $C_{02}/n.C_{01}$.

FIG. 12 shows a change in voltages $V'_{1H}$, $V'_{2H}$, $V'_{1L}$ and $V'_{2L}$ with respect to the change of the capacitance ratio, provided that the inverter IV of the type that match with the capacitance ratio of 1 is employed. In FIG. 12, broken lines indicate in the case where the 2-terminal oscillating element $CR_1$ associated with two capacitors $C_1$ and $C_2$ is employed and the solid lines indicate in the case where the 3-terminal oscillating element $CR_2$ is employed.

As apparent from the graph of FIG. 12, since the solid lines are very similar to the broken lines, the 3-terminal oscillating element $CR_2$ can be provided in place of the combination of 2-terminal oscillating element $CR_1$ and the capacitors $C_1$ and $C_2$ without change in the oscillating condition. In other words, the 3-terminal oscillating element $CR_2$ will offer a stable oscillating condition much the same as that offered by the combination of 2-terminal oscillating element $CR_1$ and the capacitors $C_1$ and $C_2$, particularly when used in a region between two parallel broken lines.

Figure 13:
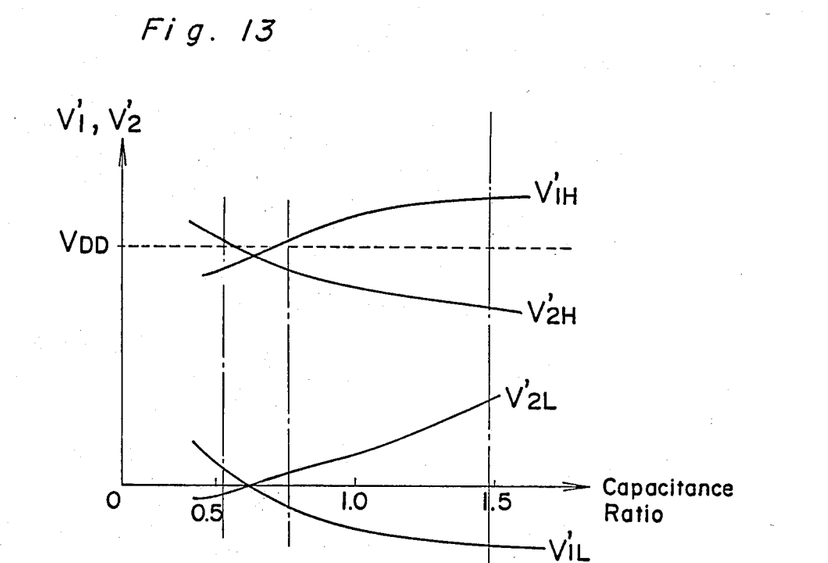
Figure 14:
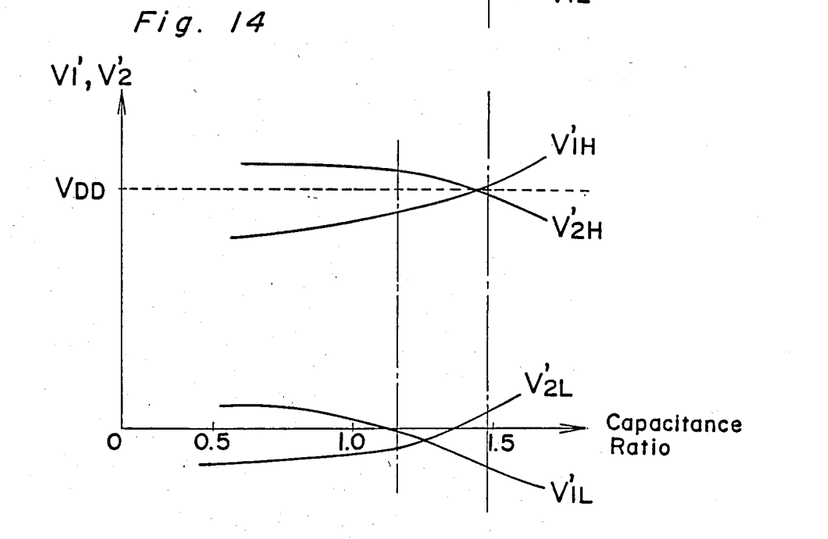

FIGS. 13 and 14 show graphs similar to FIG. 12 and, more particularly, FIG. 13 shows a case in which the inverter IV of a type that match with the capacitance ratio smaller than 1 is employed, and FIG. 14 shows a case in which the inverter IV of a type that match with the capacitance ratio greater than 1 is employed. In Both FIGS. 13 and 14, only the relations obtained by the arrangement of the present invention are shown by solid lines and no relation of prior art is shown for the reason that the curves for the prior art would be very similar to the curves shown in these FIGS. 13 and 14. In either one of the graphs of FIGS. 13 and 14, the oscillation will be carried out in a stable condition so long as the capacitance ratio $C_{02}/n \cdot C_{01}$ falls in a region defined between two parallel broken lines.

From the graphs of FIGS. 12, 13 and 14, a stable oscillation will be obtained with the use of 3-terminal oscillating element $CR_2$ in place of the combination of 2-terminal oscillating element $CR_1$ and externally provided capacitors $C_1$ and $C_2$ when the capacitance ratio $C_{02}/n \cdot C_{01}$ falls between 0.5 and 1.5, that is when $$0.5 \leq \frac{C_{02}}{n \cdot C_{01}} \leq 1.5.$$

According to the present invention, a ratio of area $S_2$ of the rim electrode 3 to area $S_1$ of the center electrode 2 should be fixed between 1 and 10, as expressed below:

$$1 \leq \frac{S_2}{S_1} \leq 10$$

When this requirement is satisfied, the expansion mode vibration, which is the required mode of vibration, is effected at a high level, and the thickness mode vibration, which is the spurious vibration, is effected at a low level. If the ratio $S_2/S_1$ becomes smaller than 1, the thickness mode vibration becomes great, and if the ratio $S_2/S_1$ becomes greater than 10, the expansion mode vibration becomes small.

It is to be noted that, although there is some relationship between the capacitance $C_{01}$ (or $C_{02}$) and the area $S_1$ (or $S_2$), the capacitance $C_{01}$ (or $C_{02}$) can be determined also in relation to other factors, such as a material for the piezoelectric body and the degree of polarization. Thus, the capacitance $C_{01}$ (or $C_{02}$) and the area $S_1$ (or $S_2$) can be determined separately.

As has been described in the forgoing embodiment, the 3-terminal oscillating element $CR_2$ according to the present invention is developed in consideration of prior art 2-terminal oscillating element $CR_1$ coupled with two externally provided capacitors $C_1$ and $C_2$ such that the capacitance ratio $C_{02}/n \cdot C_{01}$ is so adjusted by the setting of input and output capacitances $C_{01}$ and $C_{02}$ and the transformation ratio n of an ideal transformer as to be equal to the capacitance ratio $C_2/C_1$ previously measured. When this is done, the oscillating circuit with the use of 3-terminal oscillating element $CR_2$ can oscillate in a stable condition as obtained when the combination of 2-terminal oscillating element $CR_1$ and externally provided capacitors $C_1$ and $C_2$ is employed in the oscillating circuit. Furthermore, when the 3-terminal oscillating element of the present invention is employed, it is not necessary to employ the externally provided capacitors, and yet the temperature characteristic of the oscillating frequency will be excellent.

Furthermore, according to the present invention, since the ratio of area $S_2$ of the rim electrode 3 to area $S_1$ of the center electrode 2 is selected between 1 and 10, oscillating element $CR_2$ can vibrate under the expansion mode vibration with a high amplitude and less interference of the thickness mode vibration.

Figure 15:
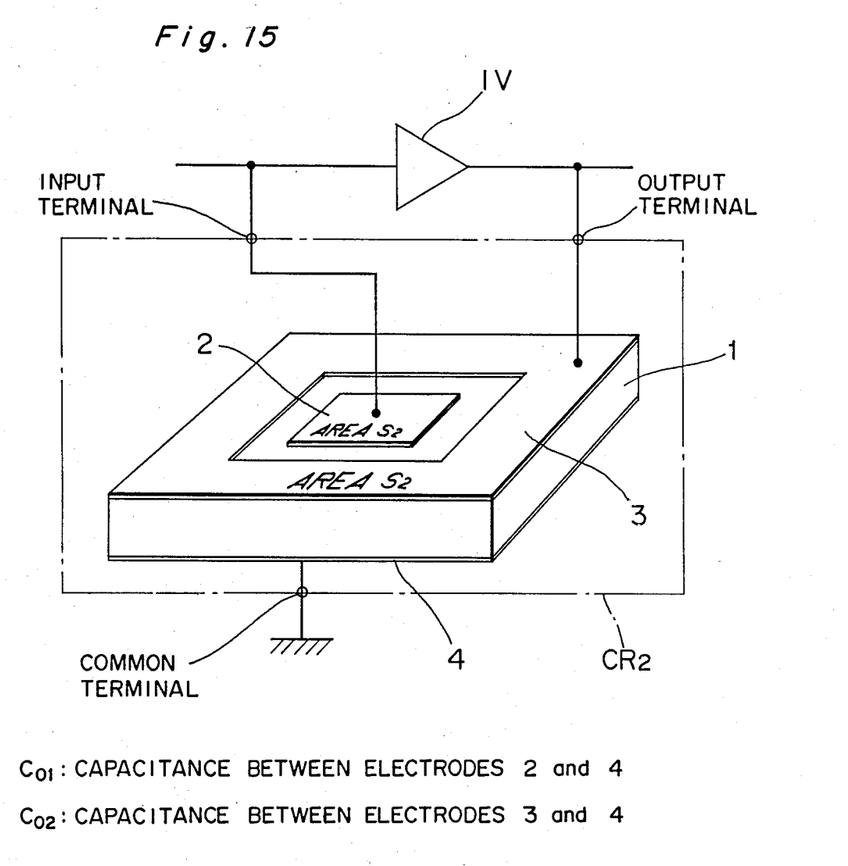
FIG. 15 is a diagrammatic view of an oscillator according to the present invention.

Referring to FIG. 15, an oscillator according to the present invention is shown, which comprises oscillating element $CR_2$ of the above described type and amplifier IV. It is to be noted that center electrode 2 should be connected to the input terminal of 3-terminal oscillating element $CR_2$, which is also connected to the input side of amplifier IV, and rim electrode 3 should be connected to the output terminal 11, which is also connected to the output side of amplifier IV.

By the above arrangement, an oscillator which operates under the expansion mode vibration with less thickness mode vibration can be realized. This result is obtained only when the center electrode 2 is connected to the input of the amplifier and the rim electrode 3 is connected to the output of the amplifier.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of appended claims.

What is claimed is:

1. A 3-terminal oscillating element (CR$_2$) provided in place of a combination of 2-terminal oscillating element (CR$_1$) and two externally provided capacitors (C$_1$ and C$_2$) in a Colpitts circuit, wherein the first external capacitor (C$_1$) is connected to the input side of an amplifier of said Colpitts circuit and the second external capacitor (C$_2$) is connected to the output side of said amplifier, said 3-terminal oscillating element (CR$_2$) having: a piezoelectric body (1) having first and second surfaces in face-to-face relation to each other, said piezoelectric body having a central section pre-polarized in one direction between said first and second surfaces and a perimeter section pre-polarized in the opposite direction to said one direction; a first electrode (2) provided on the first surface over said central section of the piezoelectric body; a second electrode (3) provided on the first surface, in a spaced relation to said first electrode (2) and over said perimeter section of the piezoelectric body; and a counter electrode (4) provided on said second surface covering both said first and second sections of said piezoelectric body, said 3-terminal oscillating element (CR$_2$) characterized in that:

the following equations are substantially satisfied:

$$\frac{C_2}{C_1} = \frac{1}{n} \cdot \frac{C_{02}}{C_{01}}$$

wherein $C_{01}$ is an electrostatic capacitance between the first electrode (2) and the counter electrode (4), $C_{02}$ is an electrostatic capacitance between the second electrode (3) and the counter electrode (4), and n is an transformation ratio of an ideal transformer; and $$1 \leq \frac{S_2}{S_1} \leq 10$$

wherein $S_1$ and $S_2$ are areas of first and second electrodes, respectively.

2. A 3-terminal oscillating element as claimed in claim 1, wherein said second electrode is connected to an output terminal, which is connected to said output side of said amplifier, and said first electrode is connected to an input terminal, which is connected to said input side of said amplifier.

3. A 3-terminal oscillating element as claimed in claim 1, characterized in that:

$$0.5 \leq \frac{C_{02}}{n \cdot C_{01}} \leq 1.5.$$

4. An oscillator comprising:

a 3-terminal oscillating element (CR$_2$) provided in place of a combination of 2-terminal oscillating element (CR$_1$) and two externally provided capacitors (C$_1$ and C$_2$) in a Colpitts circuit, wherein the first external capacitor (C$_1$) is connected to the input side of an amplifier of said Colpitts circuit and the second external capacitor (C$_2$) is connected to the output side of said amplifier, said 3-terminal oscillating element (CR$_2$) having: a piezoelectric body (1) having first and second surfaces in face-to-face relation to each other, said piezoelectric body having a perimeter section pre-polarized in one direction between said first and second surfaces and a central section pre-polarized in the opposite direction to said one direction; a first electrode (2) provided on the first surface over said perimeter section of the piezoelectric body; a second electrode (3) provided on the first surface, in a spaced relation to said first electrode (2) and over said central section of the piezoelectric body (1); and a counter electrode (4) provided on said second surface covering both said first and second sections of said piezoelectric body, said 3-terminal oscillating element (CR$_2$) satisfying the following equations:

$$\frac{C_2}{C_1} = \frac{1}{n} \cdot \frac{C_{02}}{C_{01}}$$

wherein $C_{01}$ is an electrostatic capacitance between the first electrode (2) and the counter electrode (4), $C_{02}$ is an electrostatic capacitance between the second electrode (3) and the counter electrode (4), and n is an transformation ratio of an ideal transformer; and $$1 \leq \frac{S_2}{S_1} \leq 10$$

wherein $S_1$ and $S_2$ are areas of first and second electrodes, respectively; and said amplifier having its output connected to said first electrode and its input connected to said second electrode.

5. A method of manufacturing a 3-terminal oscillating element (CR$_2$) provided in place of a combination of 2-terminal oscillating element (CR$_1$) and two externally provided capacitors (C$_1$ and C$_2$) in a Colpitts circuit, wherein the first external capacitor (C$_1$) is connected to the input side of an amplifier of said Colpitts circuit and the second external capacitor (C$_2$) is connected to the output side of said amplifier, said 3-terminal oscillating element (CR$_2$) having: a piezoelectric body (1) having first and second surfaces in face-to-face relation to each other, said piezoelectric body having a perimeter section pre-polarized in one direction between said first and second surfaces and a central section pre-polarized in the opposite direction to said one direction; a first electrode (2) provided on the first surface over said perimeter section of the piezoelectric body; a second electrode (3) provided on the first surface, in a spaced relation to said first electrode (2) and over said central section of the piezoelectric body (1); and a counter electrode (4) provided on said second surface covering both said first and second sections of said piezoelectric body, said method comprising the steps of:

measuring a capacitance ratio $C_2/C_1$; and preparing said 3-terminal oscillating element ($CR_2$) so as to substantially satisfy the following equations:

$$\frac{C_2}{C_1} = \frac{1}{n} \cdot \frac{C_{02}}{C_{01}}$$

wherein $C_{01}$ is an electrostatic capacitance between the first electrode (2) and the counter electrode (4), $C_{02}$ is an electrostatic capacitance between the second electrode (3) and the counter electrode (4), and n is an transformation ratio of an ideal transformer; and $$1 \leq \frac{S_2}{S_1} \leq 10$$

wherein $S_1$ and $S_2$ are areas of first and second electrodes, respectively.

* * * * *